Dec. 14, 1965 N. R. LA FOND ETAL 3,223,933

SINGLE-ENDED PUSH-PULL DISTORTIONLESS POWER AMPLIFIER INCLUDING D.C. FEEDBACK

Filed Dec. 21, 1962 2 Sheets-Sheet 1

United States Patent Office 3,223,933
Patented Dec. 14, 1965

3,223,933

SINGLE-ENDED PUSH-PULL DISTORTIONLESS POWER AMPLIFIER INCLUDING D.C. FEED-BACK

Norman R. La Fond, Commack, and Carl R. Wilhelmsen, Huntington Station, N.Y., assignors to Hazeltine Research Inc., a corporation of Illinois Filed Dec. 21, 1962, Ser. No. 246,424
3 Claims. (Cl. 330—15)

The present invention relates to a transistor power amplifier apparatus capable of delivering a constant power output over a range of frequencies extending from nearly D.-C. to beyond the audio range. These output signals are of such magnitude and fidelity that the invention may be used in many applications. Two such applications are in home high fidelity systems, where the power requirements are relatively low, 50 watts or less, and in sound simulation devices, where the power requirements are relatively high, often in the neighborhood of 1,000 watts or more.

If a conventional transistor power amplifier or push-pull configuration were employed to satisfy high power requirements, such as that of the above mentioned simulation system, the output transformer required would tend to be bulky and heavy. It is well known that transformers are never "ideal" but have relatively poor response characteristics at low frequencies. To additionally satisfy high power requirements at frequencies approximating D.-C., an output transformer would be required that would be physically prohibitive. Furthermore, the transformer used in the driver stage would also be rather large. As a result, the amplifier may become disproportionately large when compared with one whose frequency response characteristic is not as stringent.

In addition to the objection to the use of transformers because of increased size and weight, is the objection because of increased cost—the larger the transformer, the greater its cost. Therefore, the use of transformers in power amplifying apparatus, in which it is required to amplify very low frequency signals, should be as limited as possible.

It is an object of the invention, therefore, to provide transistor power amplifier apparatus capable of delivering a constant power output over a range of frequencies extending from nearly D.-C. to beyond the audio range.

It is another object of the invention to provide transistor power amplifier apparatus that eliminates the need for any transformers, thereby reducing the cost, weight, and size of the apparatus.

Thus, in accordance with the invention, there is provided transistor power amplifier apparatus comprising means for supplying an input signal. The apparatus also includes transistor circuit means for deriving signals of like and unlike polarity from the input signal and having a plurality of output impedances across which these derived signals are developed. Amplifier means including at least a pair of transistor amplifier circuits and a load impedance, is further included. Each of these transistor amplifier circuits is responsive to one of the derived signals and has its respective output terminals connected to the same end of the load impedance in a single-ended fashion for providing a push-pull amplified output signal. In addition, the apparatus includes means for coupling at least a portion of the push-pull output signal to the deriving means in a bootstrap manner so that equal amplification can be achieved from each of the transistor amplifier circuits.

For a better understanding of the present invention, together with other and further objects thereof, reference is had to the following description taken in connection with the accompanying drawings, and its scope will be pointed out in the appended claims.

Referring to the drawings.

Figure 1:
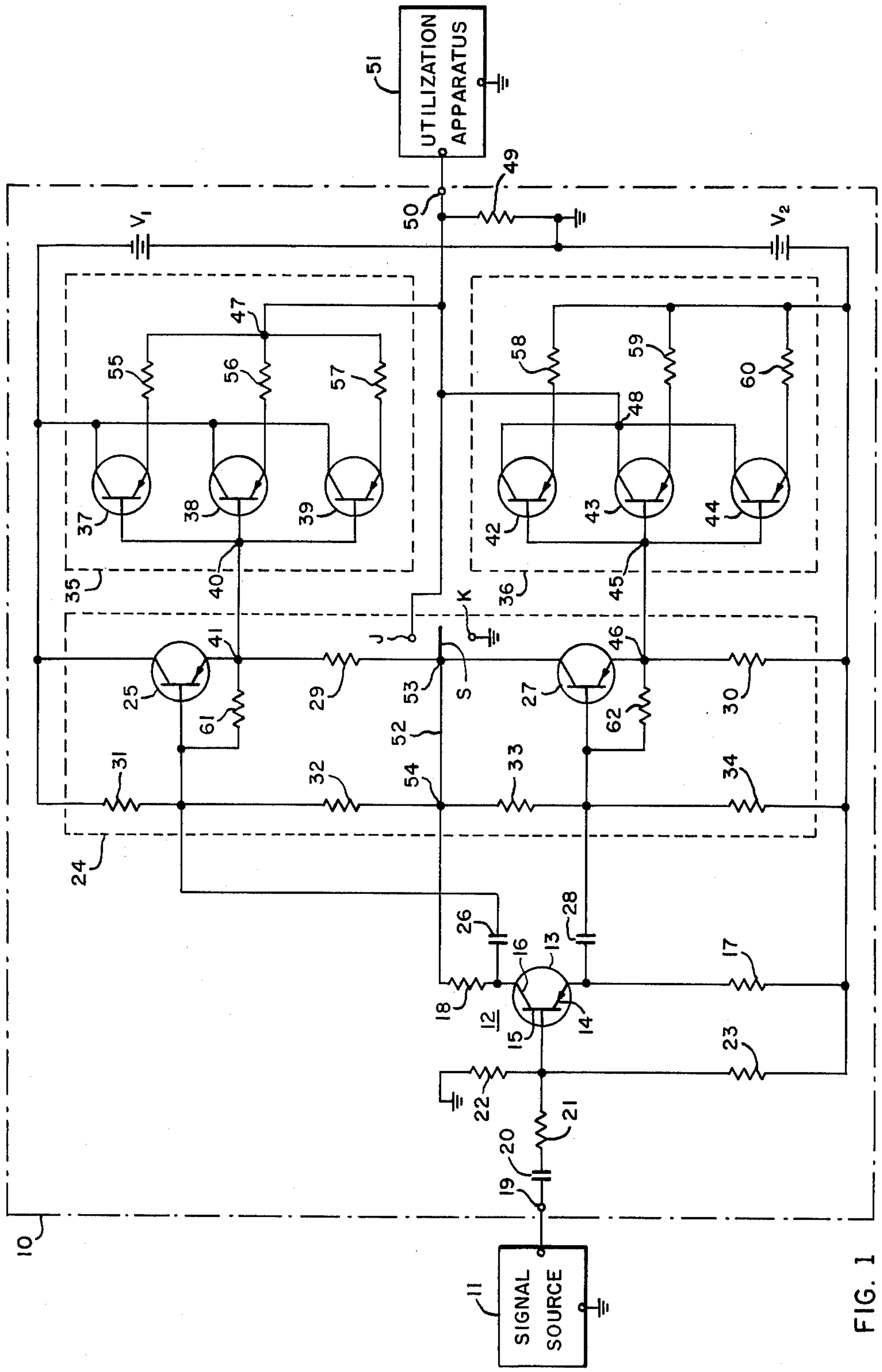
FIG. 1 is a circuit diagram, partly schematic, of a transistor power amplifier apparatus, constructed in accordance with the invention.

Referring now more particularly to FIG. 1 which embodies one form of the present invention, there is provided amplifier apparatus 10 including means such as signal source 11 for supplying an input signal. Such means may consist of the conventional phonograph pick-up-preamplifier arrangement used in high fidelity audio systems.

Transistor circuit means, such as split load phase inverter 12, responsive to the input signal and having a plurality of output impedances, is also included in apparatus 10, for developing a signal across one of the impedances of the same polarity as the input signal and a signal across another of the impedances 180° out of phase with the input signal. Such means may include transistor 13, having emitter, base, and collector electrodes 14, 15, and 16, respectively, emitter load resistor 17, and collector load resistor 18. The input signal, to which phase inverter 12 responds, is applied to base 15 from signal source 11 through input terminal 19, capacitor 20 and resistor 21. Voltage divider resistors 22 and 23 are further included to provide sufficient forward bias to base 15 to maintain transistor 13 in class A operation.

Transistor coupling means, such as unit 24, may be included in amplifier apparatus 10 for providing signals of increased drive capability for the output circuits thereof, as will be subsequently described. In particular, unit 24 includes two transistors connected in the emitter-follower configuration; one, transistor 25, is coupled to collector 16 through capacitor 26, and, one, transistor 27 is coupled to emitter 14 through capacitor 28. Resistors 29 and 30, the emitter loads of transistors 25 and 27, respectively, are also included, across which the signals of increased drive capability are developed. In addition, bias is applied to transistors 25 and 27 by voltage divider resistors 31, 32, 33, and 34 and is of a value to cause transistors 25 and 27 to operate class B.

Apparatus 10 also includes amplifier means including at least a pair of transistor amplifier circuits 35 and 36 for providing a push-pull amplified output signal. Specifically, circuit 35 contains three transistors 37, 38, and 39, connected essentially in parallel, the common base terminal 40 of which is connected to emitter 41 of transistor 25. Similarly, circuit 36 contains three paralleled transistors 42, 43, and 44, whose common base terminal 45 is connected to emitter 46 of transistor 27. Furthermore, emitter output terminal 47 and collector output terminal 48 of circuits 35 and 36, respectively, are connected to resistive load impedance 49 in a single-ended fashion, across which the push-pull signal is developed. Load impedance 49, in turn, is coupled through output terminal 50 to utilization apparatus 51 which might include a loud speaker for sound reproduction purposes.

Although amplifier circuits 35 and 36 are represented in FIG. 1 as containing three transistors each, the invention is not limited to such a configuration. The number of transistors necessary is determined by the power requirements of the individual system and by the power capabilities of the transistors themselves. Three transistors are connected in parallel in amplifier circuits 35 and 36 in order to satisfy the power requirements of the system in which apparatus 10 is environed. It is also possible to use unequal numbers of transistors in circuits 35 and 36. The only limitation is that signals of equal power be delivered to resistive load 49 from each circuit.

Amplifier apparatus 10 also includes means for coupling at least a portion of the direct-current and time-varying components of the push-pull output signal to the deriving means in a bootstrap manner. Such means may include wire 52 connecting load impedance 49 to collector load resistor 18 through switch S, in position J, and junction points 53 and 54. As will be described hereinafter, such a connection permits equal amplification to be achieved from circuits 35 and 36. Resistors 55–60 are connected in the emitter circuits of transistors 37–39 and 42–44 to provide sufficient feedback to compensate for any unbalance or difference that might exist between their respective transistors. Otherwise, circuits 35 and 36 might not deliver signals of equal power to resistive impedance 49. In addition, resistors 61 and 62 are included in unit 24 to provide equal impedance paths for the signals developed at collector 16 and emitter 14 respectively.

As can be seen from FIG. 1, all transistors employed therein are of the PNP type, however, as is well known, NPN transistors could also be used by simply reversing the polarities of voltage supplies $V_1$ and $V_2$.

Figure 2:
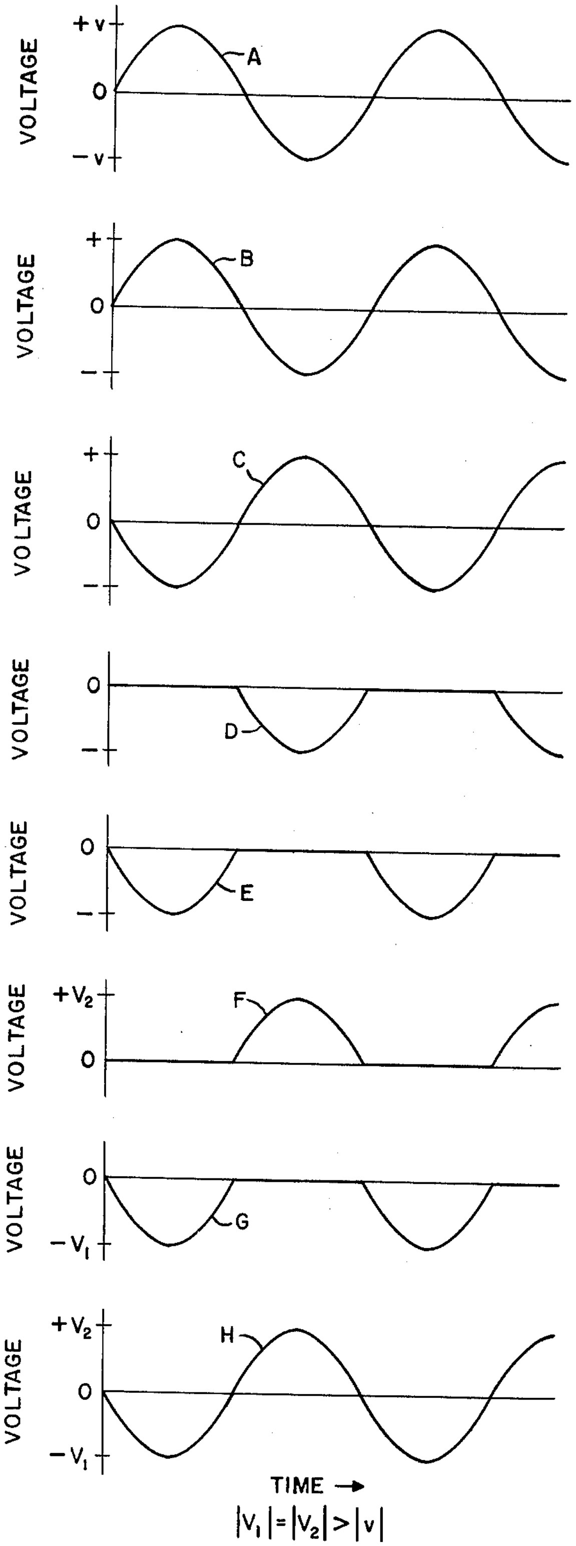
FIG. 2 is a graph of signal waveforms utilized in explaining the operation of the power amplifier apparatus of FIG. 1.

In operation, the input signal from source 11, waveform A—FIG. 2, is applied to base 15 of transistor 13 through input terminal 19, capacitor 20 and resistor 21. Application of this single input signal generates two output signals: one, across resistor 17, which is of the same polarity as the input (waveform B—FIG. 2), and one, across resistor 18, which is of opposite polarity (waveform C—FIG. 2). However, whereas the signal developed across resistor 17, is referenced to A.-C. ground potential, through voltage supply $V_2$, the signal developed across resistor 18 is not, but is floating. The reason for this will be more fully explained hereinafter.

Since emitter-follower transistors 25 and 27 are biased to operate class B, the signals appearing at their emitters will follow the signals appearing at their respective bases only during the negative half-cycle of those signals. During the positive half-cycle, no current will flow and no signal will be developed at their emitters. Thus, capacitive coupling of the signal developed across resistor 17 to the base of transistor 27 produces a signal at emitter 46 of waveform D—FIG. 2. Similarly, a signal of waveform E—FIG. 2 is developed at emitter 41. But, due to the presence of wire 52 connecting junction point 53 to resistor 18, the signal at emitter 41 is also floating.

Application of the signal at emitter 46 (waveform D—FIG. 2) to base terminal 45 of amplifier circuit 36 produces a signal of waveform F—FIG. 2 at collector output terminal 48. This signal is an amplified, inverted version of that at emitter 46 because transistors 42–44 are in a common emitter configuration. Furthermore, application of the signal at emitter 41 (waveform E—FIG. 2) to base terminal 40 of amplifier circuit 35 produces a signal of waveform G—FIG. 2 at emitter output terminal 47. However, because the signal at emitter 41 is not referenced to ground, its application to circuit 35 results in a signal being developed at output terminal 47 that is an amplified but uninverted version of that at emitter 41. This results because the signal at emitter 41 is applied between common base terminal 40 and emitter output terminal 47 of transistors 37–39 and the output signal taken between terminal 47 and ground.

Waveform H in FIG. 2 represents the push-pull output signal of amplifier apparatus 10 that is developed at terminal 50, across load 49, by the simultaneous action of amplifier circuits 35 and 36.

To understand why the signal across collector resistor 18 is not referenced to ground is to understand why the output signal across load 49 is bootstrapped to the deriving means. Assume that switch S is in position K, thereby disconnecting junction points 53 and 54 from load 49 and connecting them to ground instead. Then, then the signal at collector 16 of transistor 13 would not be floating but would be referenced to ground. In addition, the signal at emitter 41 of transistor 25 would also be referenced to ground. If this were the case, transistors 37–39 would perform as an emitter follower, that is, the signal at emitter output terminal 47 would be of the same polarity as the signal at emitter 41 but would also be of the same magnitude. Transistors 42–44, however, being still connected as a common emitter amplifier, develop a signal at collector output terminal 48 that is much greater than that at terminal 47. As a result, the balance between amplifier circuits 35 and 36 would be destroyed. In order for circuits 35 and 36 to deliver signals of equal power to load impedance 49, the signal at emitter 41 must be applied between common base terminal 40 and emitter output terminal 47, not between base terminal 40 and ground. This is accomplished by the bootstrap connection from load impedance 49 through wire 52 to collector resistor 18.

Although waveforms A–H in FIG. 2 illustrate the over-all amplification of the input signal, it is also an indication of the power amplification capabilities of apparatus 10. This is so because the power output of apparatus 10 is directly related to the voltage developed across load impedance 49. Through proper selection of voltage supplies $V_1$ and $V_2$, resistive impedance 49, and the transistors used, it is possible to develop an output signal of either low or high power, and, furthermore, one which is independent of the frequency of the input signal.

While there has been described what is at present considered to be the preferred embodiment of this invention, it will be obvious to those skilled in the art that various changes and modifications may be made therein without departing from the invention and it is, therefore, aimed to cover all such changes and modifications as fall within the true spirit and scope of the invention.

What is claimed is:

1. Transistor power amplifier apparatus comprising: means for supplying an input signal;

transistor circuit means coupled to said signal supply means for deriving signals of like and unlike polarity from said input signal and having a plurality of output impedances across which said derived signals are developed;

transistor amplifier coupling means coupled to said transistor circuit means and being responsive to said derived signals for providing increased drive to said like and unlike polarity signals;

amplifier means coupled to said transistor amplifier coupling means including at least a pair of transistor amplifier circuits and a load impedance, each of said transistor amplifier circuits being responsive to one of said increased drive signals and having their respective output terminals connected to the same end of said load impedance in a single-ended fashion for providing a push-pull amplifier output signal;

and means for direct-current coupling said push-pull output signal to said deriving means in a bootstrap manner for providing equal, distortion-free amplification from each of said transistor amplifier circuits over a range of frequencies extending from nearly D.-C. to beyond the audio range.

2. Apparatus according to claim 1 wherein said coupling means includes at least a pair of transistors connected in the emitter-follower configuration, the base electrode of one of which is coupled to the collector electrode in said deriving means and the base electrode of another of which is coupled to the emitter electrode in said deriving means.

3. Apparatus according to claim 2 in which said transistors are biased to operate class B.

References Cited by the Examiner

UNITED STATES PATENTS

| | | | |
|---|---|---|---|
| 2,777,020 | 1/1957 | Dobosy | 330—70 |
| 2,802,907 | 8/1957 | Peterson et al. | 330—156 XR |
| 2,929,026 | 3/1960 | Walker | 330—70 X |

OTHER REFERENCES

Aronson et al.: Transistor Audio Frequency Amplifier, RCA TN No. 36, Aug. 9, 1957.

ROY LAKE, *Primary Examiner.*

NATHAN KAUFMAN, *Examiner.*